United States Patent
Lee et al.

(10) Patent No.: US 8,199,306 B2
(45) Date of Patent: Jun. 12, 2012

(54) PRINTED CIRCUIT BOARD, BACKLIGHT UNIT HAVING THE PRINTED CIRCUIT BOARD, AND LIQUID CRYSTAL DISPLAY DEVICE HAVING THE PRINTED CIRCUIT BOARD

(75) Inventors: Gwan-Hyoung Lee, Suwon-si (KR);
Young-Bee Chu, Yongin-si (KR);
Sang-Hee Lee, Suwon-si (KR);
Jeong-Seok Oh, Seoul (KR);
Young-Soo Kim, Seongnam-si (KR);
Wal-Hee Kim, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 681 days.

(21) Appl. No.: 12/343,183

(22) Filed: Dec. 23, 2008

(65) Prior Publication Data

US 2009/0190061 A1    Jul. 30, 2009

(30) Foreign Application Priority Data

Jan. 29, 2008    (KR) ........................ 10-2008-0008931

(51) Int. Cl.
*G02F 1/1345* (2006.01)
(52) U.S. Cl. ........................................ 349/149; 349/150
(58) Field of Classification Search .................. None
See application file for complete search history.

(56) References Cited

U.S. PATENT DOCUMENTS

| | | | | |
|---|---|---|---|---|
| 5,355,280 A * | 10/1994 | Rothlingshofer et al. | .... | 361/705 |
| 6,028,472 A * | 2/2000 | Nagumo | ........ | 327/512 |
| 6,045,240 A * | 4/2000 | Hochstein | ........ | 362/294 |
| 2004/0012964 A1 | 1/2004 | Makuta | | |
| 2006/0012731 A1 * | 1/2006 | Ishiwa et al. | ........ | 349/65 |
| 2006/0214743 A1 * | 9/2006 | Arai et al. | ........ | 331/176 |
| 2008/0137308 A1 | 6/2008 | MacDonald et al. | | |
| 2008/0143916 A1 | 6/2008 | Fujino et al. | | |

FOREIGN PATENT DOCUMENTS

| | | |
|---|---|---|
| CN | 101109871 | 1/2008 |
| DE | 20 2004 002 921 | 5/2007 |
| JP | 2005-276943 | 10/2005 |
| JP | 2006-310123 | 11/2006 |
| KR | 1020070083342 | 8/2007 |

OTHER PUBLICATIONS

Machine translation of JP 2005-217644.*
English Abstract for Publication No. 2005-276943.
English Abstract for Publication No. 2006-310123.
English Abstract for Publication No. 1020070083342.
English Abstract for Publication No. DE 20 2004 002 921.
English Abstract for Publication No. CN 101109871.

* cited by examiner

*Primary Examiner* — Lucy Chien
(74) *Attorney, Agent, or Firm* — F. Chau & Associates, LLC

(57) ABSTRACT

A printed circuit board (PCB) includes a base substrate, an electrical wiring, a dummy pad and a thermally conductive adhesion member. The base substrate includes a light-emitting diode (LED) mounted on a first surface of the base substrate. The electrical wiring is electrically connected to the LED. The dummy pad is formed on the first surface to be connected to the electrical wiring. The thermally conductive adhesion member is attached to a second surface of the base substrate. Therefore, superior heat radiation may be obtained, thereby reducing or preventing damage to the LED and the LCD device using the LED by radiating the heat from the LED used as a light source.

19 Claims, 4 Drawing Sheets

PRINTED CIRCUIT BOARD, BACKLIGHT UNIT HAVING THE PRINTED CIRCUIT BOARD, AND LIQUID CRYSTAL DISPLAY DEVICE HAVING THE PRINTED CIRCUIT BOARD

CROSS-REFERENCE TO RELATED APPLICATIONS

This application claims priority under 35 U.S.C. §119 to Korean Patent Application No. 10-2008-008931, filed on Jan. 29, 2008 in the Korean Intellectual Property Office (KIPO), the contents of which are herein incorporated by reference in their entirety.

BACKGROUND OF THE INVENTION

1. Field of the Invention

The present invention relates to a printed circuit board (PCB), and more particularly, to a PCB, a backlight unit having the PCB and a liquid crystal display (LCD) device having the PCB.

2. Description of the Related Art

A liquid crystal display (LCD) device displays images by using liquid crystal, of which electrical and optical characteristics vary in response to an electric field applied thereto. LCD devices have various characteristics such as being thin, having a lower driving voltage, having a lower power consumption, etc., than other types of display devices such as cathode ray tube (CRT) devices, plasma display panel (PDP) devices, etc. Therefore, LCD devices are used in notebook computers, monitors, televisions, mobile phones, etc. An LCD device is a non-emissive type display device, and thus the LCD device necessarily requires a light source, such as a backlight assembly to supply an LCD panel of the LCD device with light.

A conventional LCD device mainly employs a light source, such as a cold cathode fluorescent lamp (CCFL), a flat fluorescent lamp (FFL), a light-emitting diode (LED), etc., which emits white light. LEDs may be manufactured in a chip form and have low power consumption, good color reproduction, high luminance and so on. Accordingly, LEDs are being used for light sources of backlight assemblies.

However, LEDs have a disadvantage in that LEDs emit a large amount of heat. The heat generated from an LED may deteriorate an LED chip and a fluorescent substance used thereon, and affect other characteristics of the LED chip. Moreover, the heat generated from the LED may increase the inner temperature of an LCD device that uses the LED as a light source, so that liquid crystal molecules of the LCD device may be deteriorated or an optical member of the LCD device may become wrinkled such that the display quality of the LCD device may be decreased. In particular, the heat emitted from the LED may be a particular concern when a high-luminance LED is used in the LCD device.

SUMMARY OF THE INVENTION

Exemplary embodiments of the present invention provide a printed circuit board (PCB) capable of radiating heat generated from a light-emitting diode (LED) mounted on the PCB, a backlight unit having the above-mentioned PCB, and a liquid crystal display (LCD) device having the above-mentioned PCB.

According to one aspect of the present invention, a PCB includes a base substrate, electrical wiring, a dummy pad and a thermally conductive adhesion member. The base substrate includes an LED mounted on a first surface of the base substrate. The electrical wiring is electrically connected to the LED. The dummy pad is formed on the first surface to be connected to the electrical wiring. The thermally conductive adhesion member is attached to a second surface of the base substrate.

According to another aspect of the present invention, a PCB includes a thermally conductive adhesion member, a covering member and an LED. The thermally conductive adhesion member has electrical wiring formed on a first surface of the thermally conductive adhesion member. The covering member covers the first surface of the thermally conductive adhesion member. The covering member has an opening formed thereon. The LED is connected to the electrical wiring through the opening of the covering member.

According to still another aspect of the present invention, a backlight unit includes an optical member, a PCB and a bottom chassis. The PCB includes a base substrate, a dummy pad and a thermally conductive adhesion member. The base substrate includes an LED mounted on a first surface of the base substrate and electrical wiring electrically connecting the LED. The dummy pad is formed on the first surface to be connected to the electrical wiring. The thermally conductive adhesion member is attached to a second surface of the base substrate. The bottom chassis receives the optical member and the PCB.

According to further still another aspect of the present invention, a LCD device includes an LCD panel and a backlight unit providing the LCD panel with light. The backlight unit includes an optical member, a PCB and a bottom chassis. The PCB includes a base substrate, a dummy pad and a thermally conductive adhesion member. The base substrate includes an LED mounted on a first surface of the base substrate and electrical wiring electrically connecting the LED. The dummy pad is formed on the first surface to be connected to the electrical wiring. The thermally conductive adhesion member is attached to a second surface of the base substrate. The bottom chassis receives the optical member and the PCB.

Accordingly exemplary embodiments of the present invention provide for a PCB, a backlight unit having the PCB and an LCD device having the PCB, each with superior heat dissipation characteristics. Moreover, damage to the LED and the LCD device using the LED may be reduced or prevented by radiating the heat from the LED used as a light source.

BRIEF DESCRIPTION OF THE DRAWINGS

The above and other aspects of exemplary embodiments of the present invention will become readily apparent by reference to the following detailed description when considered in conjunction with the accompanying drawings wherein.

DETAILED DESCRIPTION OF THE EXEMPLARY EMBODIMENTS

Figure 1:
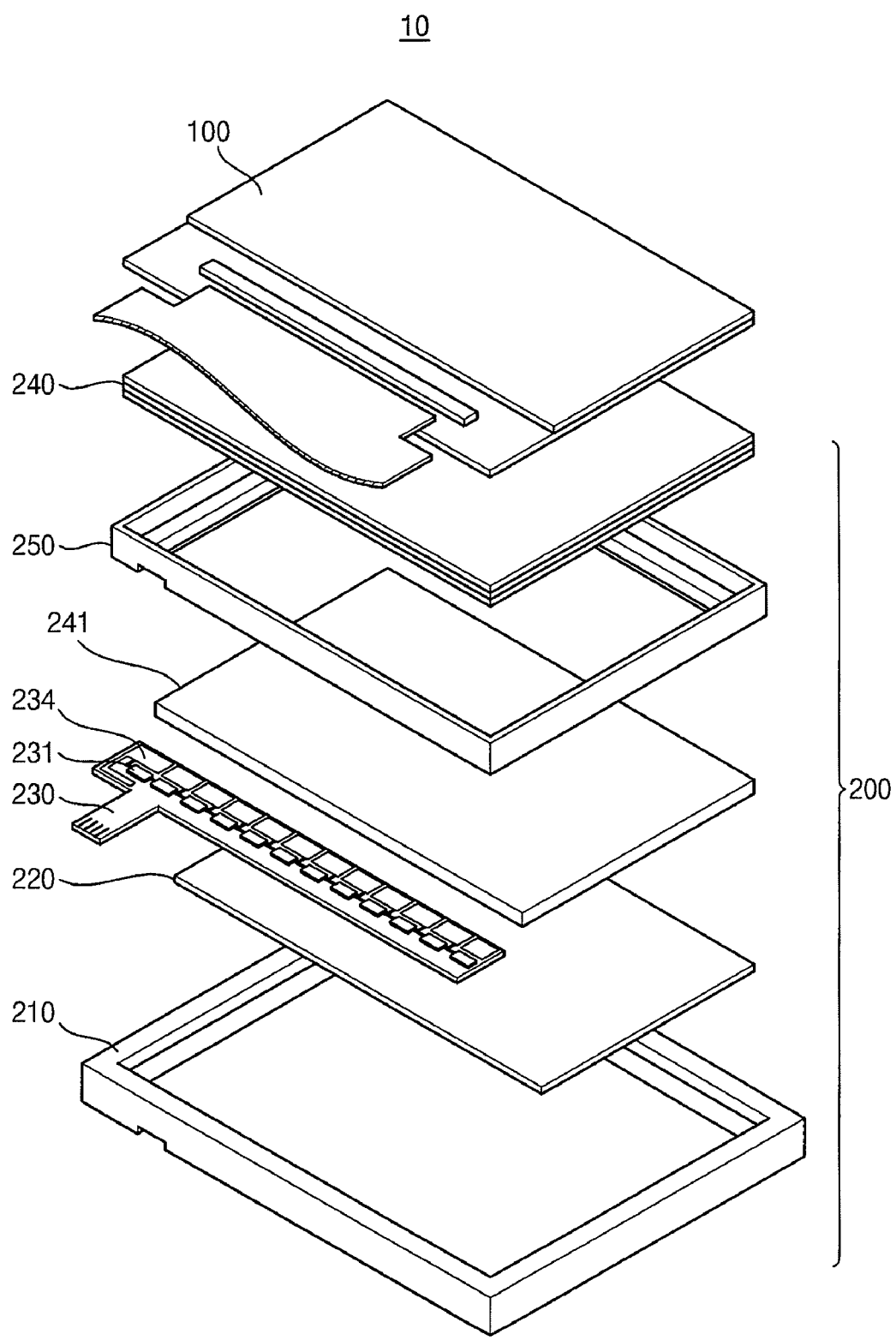
FIG. 1 is an exploded perspective view illustrating a liquid crystal display (LCD) device according to an exemplary embodiment of the present invention.

Exemplary embodiments of the invention are described more fully hereinafter with reference to the accompanying drawings. This invention may, however, be embodied in many different forms and should not be construed as limited to the embodiments set forth herein. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numbers may refer to like elements throughout the disclosure.

Hereinafter, exemplary embodiments of the present invention will be described in detail with reference to the accompanying drawings.

FIG. 1 is an exploded perspective view illustrating a liquid crystal display (LCD) device according to an exemplary embodiment of the present invention.

Referring to FIG. 1, an LCD device 10 includes an LCD panel 100 and a backlight assembly 200. The LCD panel 100 displays an image by controlling an amount of light provided from the exterior.

The backlight unit 200 provides the LCD panel 100 with light, and includes a bottom chassis 210, a reflective plate 220, a printed circuit board (PCB) 230, a light-emitting diode (LED) 231, a light-guide plate (LGP) 241, a mold frame 250 and an optical member 240.

The bottom chassis 210 includes a bottom plate and a plurality of side walls extended from an edge of the bottom plate to form a receiving space. The bottom chassis 210 receives the reflective plate 220, the PCB 230, the LED 231, the LGP 241 and the mold frame 250. The reflective plate 220 is disposed under the PCB 230 to reflect light leaking from the LED 231 toward the LGP 241.

The PCB 230 has an electric wiring (not shown) formed thereon. The LED 231 is electrically connected to the electric wiring and is mounted to the PCB 230. The PCB 230 has a dummy pad 234 formed at a peripheral area of the electric wiring and the LED 231 to diffuse heat generated from the LED 231.

The LGP 241 guides light generated from the LED 231 to emit the light toward the LCD panel 100. The mold frame 250 supports the PCB 230 and the optical member 240 and supports the LCD panel 100 disposed on the optical member 240. The optical member 240 includes a plurality of optical sheets.

The optical member 240 uniformly diffuses the light generated from the LED 231 and increases an amount of the light provided to the LCD panel 100. For example, the optical member 240 includes a diffusion sheet diffusing the light from the LGP 241 and a plurality of prism sheets condensing the light diffused by the diffusion sheet. Optionally, the optical member 240 may include the LGP 241, and may further include a light reflective plate 220 reflecting the light generated from the LED 231 toward the LCD panel 100.

Hereinafter, a PCB according to an exemplary embodiment of the present invention will be described in detail with reference to FIGS. 2 to 4.

Figure 2:
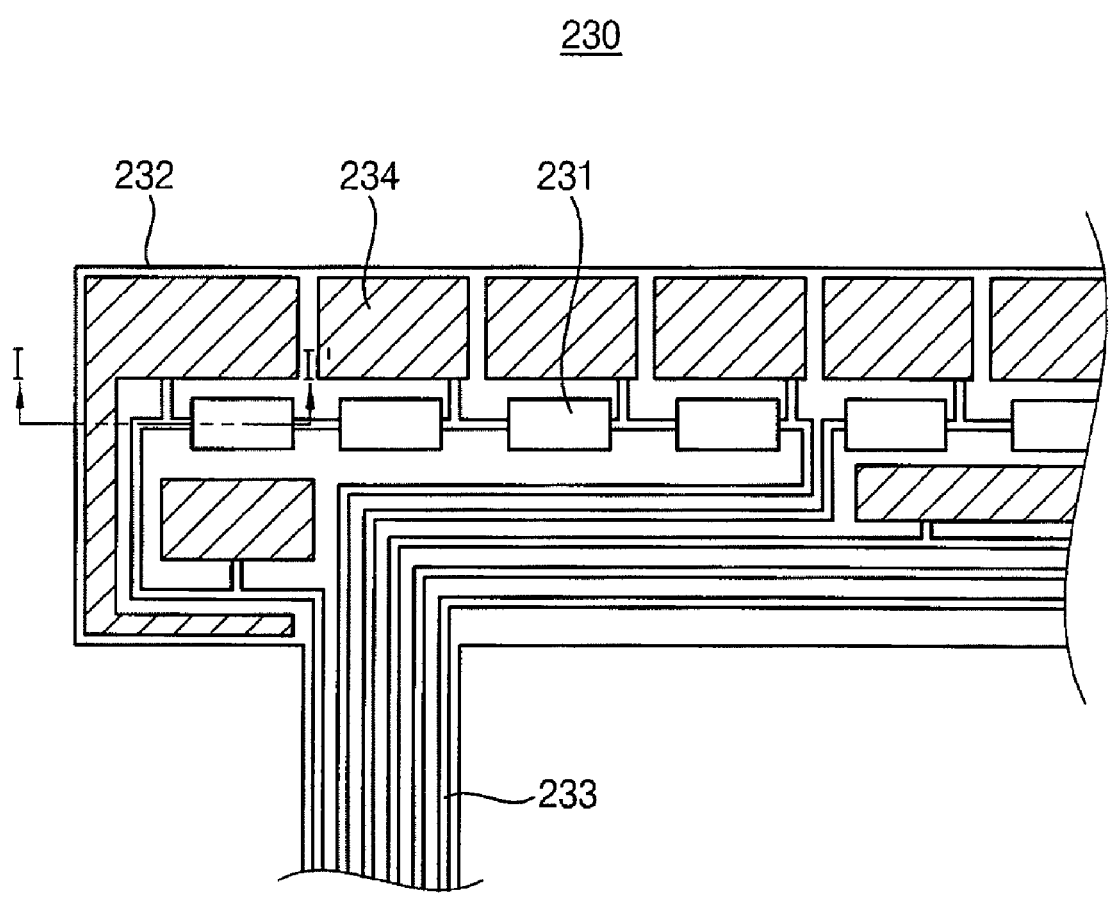
FIG. 2 is a plan view illustrating a printed circuit board (PCB) according to an exemplary embodiment of the present invention.

FIG. 2 is a plan view illustrating a PCB 230 according to an exemplary embodiment of the present invention. FIG. 3 is a cross-sectional view taken along the line I-I' in FIG. 2.

Figure 3:
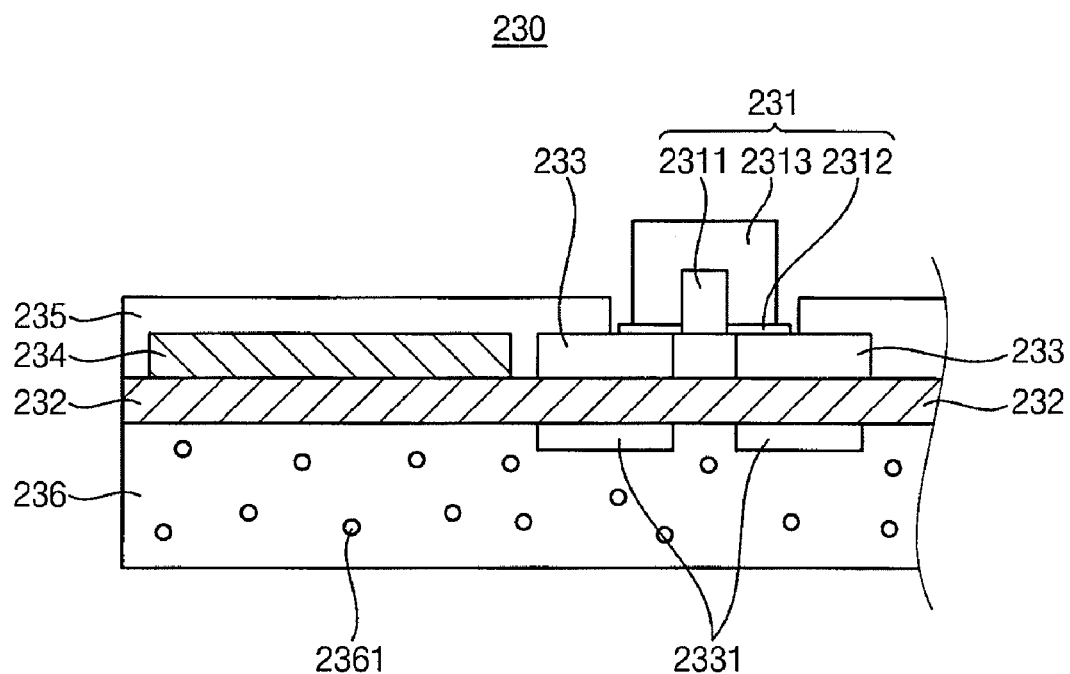
FIG. 3 is a cross-sectional view taken along the line I-I' in FIG. 2.

Referring to FIGS. 2 and 3, the PCB 230 includes a base substrate 232. At least one LED 231 is mounted on a first surface of the base substrate 232. The LED 231 includes an LED chip 2311 emitting light, an electrode 2312 connected to the LED chip 2311 and a housing 2313 receiving the LED chip 2311. The electrode 2312 is electrically connected to an electric wiring 233 formed on the base substrate 232.

The PCB 230 may be a metal-core printed circuit board (MCPCB) including a metal that has superior heat transmittance.

Moreover, an electric wiring 233 is formed on the first surface of the base substrate 232, which provides the LED 231 with a current. The electric wiring 233 may include a conductive material such as copper (Cu).

In the conventional PCB, an electric wiring for electrically connecting the LED is only formed on the first surface of the base substrate. However, in exemplary embodiments of the present invention, an electric wiring 233 and a dummy pad 234 formed in a space where the LED 231 is not formed are formed on the first surface of the PCB 230, and the electric wiring 233 is connected to the dummy pad 234. The dummy pad 234 may include a material having superior heat transmittance, and may be formed from the same material as the electric wiring 233, for example, copper (Cu). Thus, heat generated in the LED 231 is transmitted to the dummy pad 234 through the electric wiring 233 to be quickly diffused throughout the entire PCB 230.

The first surface of the base substrate 232 may be covered by a covering member 235 having insulation characteristics, and the covering member 235 may expose a portion of the electric wiring 233 at an area where the LED is mounted thereto so that the LED 231 is electrically connected to the electric wiring 233.

A heat conductive adhesion member 236 is attached to a second surface of the base substrate 232, for example, as shown the FIG. 3. The heat conductive adhesion member 236 delivers heat of the PCB 230 to a surface where the PCB 230 is attached thereto, for example, a bottom chassis 210. The heat conductive adhesion member 236 may include heat conductive ceramic particles or metal particles 2361.

An electric wiring 2331 may be formed between the second surface of the base substrate 232 and the heat conductive adhesion member 236.

Figure 4:
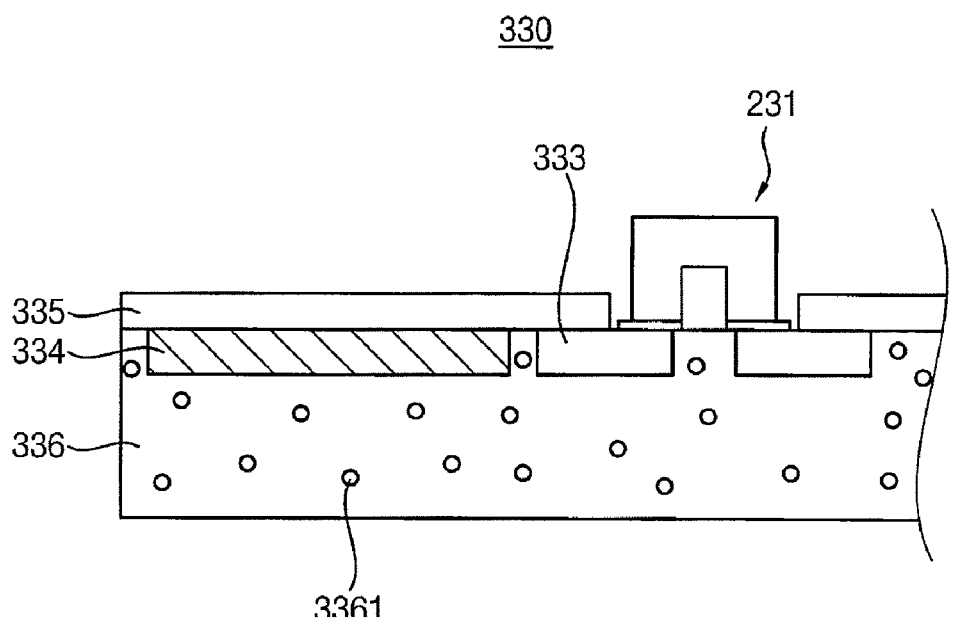
FIG. 4 is a cross-sectional view illustrating a PCB according to an exemplary embodiment of the present invention.

FIG. 4 is a cross-sectional view illustrating a PCB according to an exemplary embodiment of the present invention.

Elements shown in FIG. 4 having the same reference numerals as elements described above with respect to FIGS. 1-3 may be substantially similar. FIG. 4 is also a cross-sectional view taken along the line I-I' of FIG. 2.

Referring to FIG. 4, the PCB 330 is directly attached to a thermally conductive adhesion member 336. The electrical wiring 333 is formed on a covering member 335, and the thermally conductive adhesion member 336 is attached to the electrical wiring 333. The PCB 330 may further include a dummy pad 334 between the covering member 335 and the thermally conductive adhesion member 336.

The thermally conductive adhesion member 336 may include a plurality of thermally conductive ceramic particles 3361. The thermally conductive adhesion member 336 may be flexible.

Hereinafter, referring to FIGS. 5 and 6, a backlight unit 200 according to an exemplary embodiment of the present invention will be described. Elements shown in FIGS. 5 and 6 having the same reference numerals as elements described above with respect to FIGS. 1-4 may be substantially similar.

Figure 5:
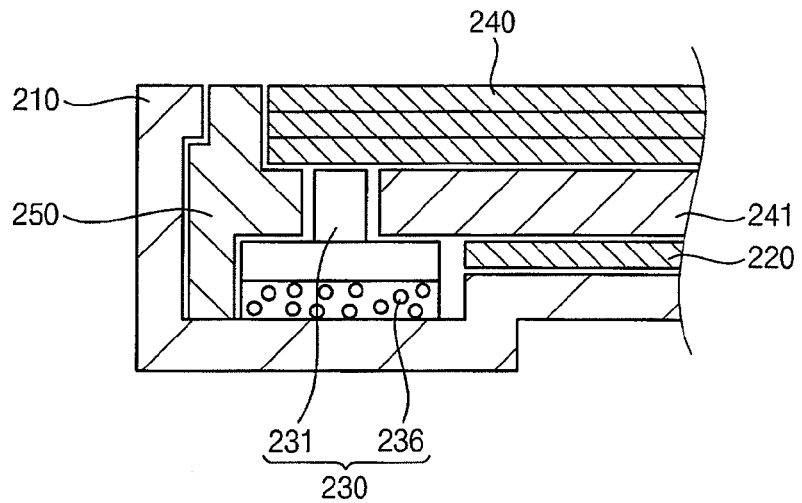
FIG. 5 is a cross-sectional view of a backlight unit according to an exemplary embodiment of the present invention.

FIG. 5 is a cross-sectional view of a backlight unit according to an exemplary embodiment of the present invention.

Referring to FIG. 5, a backlight unit 200 includes an optical member 240 including one or more optical sheets, a PCB 230 having an LED 231 mounted thereon and a bottom chassis 210 which receives the optical member 240 and the PCB 230.

The backlight unit 200 may include a mold frame 250 supporting an optical member 240. The optical member 240 may include an LGP 241. The backlight unit 200 may further include an additional reflective plate 220 for reflecting light from a LED 231 toward the optical member 240.

The bottom chassis 210 may be formed from a metal material having superior heat transmittance.

An LED 231 is mounted on a first surface of the PCB 230, and a thermally conductive adhesion member 236 is attached to a second surface of the PCB 230. In the backlight unit 200, the PCB 230 having the LED 231 mounted thereon is attached to the bottom chassis 210 by the thermally conductive adhesion member 236.

In FIG. 5, the backlight unit 200 including the PCB 230 in accordance with an exemplary embodiment as shown in FIG. 2 is shown; however, the backlight unit including the PCB 330 in accordance with an exemplary embodiment as shown in FIG. 4 may have a structure that is substantially the same as the structure of FIG. 5.

Figure 6:
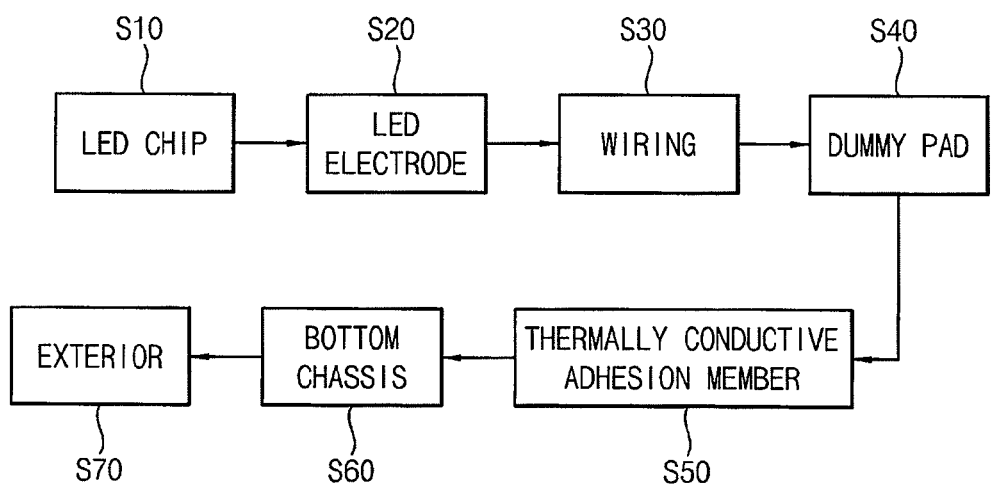
FIG. 6 is a schematic diagram showing heat flow generated in the backlight assembly of FIG. 5.

FIG. 6 is a schematic diagram showing heat flow generated in the backlight assembly of FIG. 5.

Referring to FIGS. 3, 5 and 6, a driving signal is applied to the LED chip 2311, so that the LED chip 2311 may emit light. Here, heat is generated from the LED chip 2311 (step S10). The heat generated from the LED chip 2311 is delivered to the LED electrode 2312 connected to the LED chip 2311 (step S20). The heat delivered to the LED electrode 2312 is delivered to the electrical wiring 233 connected to the LED electrode 2312 (step S30). The heat delivered to the electrical wiring 233 is delivered to the dummy pad 234 connected to the electrical wiring 233 (step S40). The heat delivered to the dummy pad 234 is delivered to the thermally conductive ceramic particles 2361 of the thermally conductive adhesion member 236 formed on the second surface of the base substrate 232 (step S50). The heat delivered to the thermally conductive adhesion member 236 is delivered to the bottom chassis 210 (step S60). The heat delivered to the bottom chassis 210 is radiated toward the exterior (step S70).

Accordingly, the heat generated from the LED chip 2311 is delivered to the electrical wiring 233, and the heat delivered to the electrical wiring 233 is quickly diffused throughout the entire PCB 230 by the dummy pad 234. The diffused heat is delivered to the bottom chassis 210 by the thermally conductive adhesion member 236 including the thermally conductive ceramic particles 2361, and then is radiated to the exterior through the bottom chassis 210. Therefore, the heat generated from the LED 231 may be effectively radiated to the exterior of the backlight unit.

Although the exemplary embodiments of the present invention have been described, it is understood that the present invention should not be limited to these exemplary embodiments but various changes and modifications can be made by one ordinary skilled in the art.

What is claimed is:

1. A printed circuit board (PCB) comprising:
   a base substrate comprising a plurality of light-emitting diodes (LEDs) mounted on a first surface of the base substrate;
   a first electrical wiring electrically connected to the LEDs formed on the first surface of the base substrate;
   a dummy pad formed on the first surface of the base substrate and connected to the first electrical wiring;
   a second electrical wiring formed on a second surface of the base substrate; and
   a thermally conductive adhesion member attached to the second surface of the base substrate and covering the second electrical wiring.

2. The PCB of claim 1, wherein the thermally conductive adhesion member comprises a plurality of thermally conductive ceramic particles.

3. The PCB of claim 1, wherein the thermally conductive adhesion member comprises one or more metal particles.

4. The PCB of claim 1, wherein the dummy pad includes a conductive material that is also included in the first electrical wiring.

5. The PCB of claim 4, wherein the conductive material comprises copper (Cu).

6. The PCB of claim 1, further comprising a covering member covering the first surface of the base substrate, wherein an opening is formed on the covering member in correspondence with the LED, the opening exposes the electrical wiring, and the LED is electrically connected to the electrical wiring through the opening.

7. The PCB of claim 1, wherein the base substrate is flexible.

8. A printed circuit board (PCB) comprising:
   a substrate having a first surface with a plurality of light-emitting diodes (LEDs) mounted thereon and a second surface;
   a first electrical wiring electrically connected to the LEDs mounted on the first surface of the substrate;
   a thermally conductive adhesion member attached to the second surface of the substrate and having a second electrical wiring formed on a first surface of the thermally conductive adhesion member; and
   a covering member covering the first surface of the thermally conductive adhesion member, the covering member having a plurality of openings formed thereon;
   wherein the plurality of LEDs is connected to the second electrical wiring through the plurality of openings of the covering member.

9. The PCB of claim 8, wherein the thermally conductive adhesion member comprises a plurality of thermally conductive ceramic particles.

10. The PCB of claim 8, further comprising a dummy pad formed on the first surface of the substrate and connected to the first electrical wiring.

11. The PCB of claim 10, wherein the dummy pad includes a conductive material that is also included in the first electrical wiring.

12. The PCB of claim 11, wherein the conductive material comprises copper (Cu).

13. A backlight unit comprising:
    an optical member;
    a printed circuit board (PCB) comprising a base substrate, a dummy pad and a thermally conductive adhesion member, the base substrate comprising a plurality of light-emitting diodes (LEDs) mounted on a first surface of the base substrate and a first electrical wiring electrically connecting the LED, the dummy pad being formed on the first surface of the base substrate and connected to the first electrical wiring, a second electrical wiring formed on a second surface of the base substrate, and the thermally conductive adhesion member being attached to the second surface of the base substrate and the second electrical wiring; and
    a bottom chassis receiving the optical member and the PCB.

14. The backlight unit of claim 13, wherein the PCB is attached to the bottom chassis by the thermally conductive adhesion member.

15. The backlight unit of claim 14, wherein the bottom chassis comprises a metal material.

16. A liquid crystal display (LCD) device comprising:
    an LCD panel; and
    a backlight unit providing the LCD panel with light, the backlight unit comprising:

an optical member;

a printed circuit board (PCB) comprising a base substrate, a dummy pad and a thermally conductive adhesion member, the base substrate comprising a plurality of light-emitting diodes (LEDs) mounted on a first surface of the base substrate and a first electrical wiring electrically connecting the plurality of LEDs, the dummy pad being formed on the first surface of the base substrate and connected to the first electrical wiring, a second electrical wiring formed on a second surface of the base substrate, and the thermally conductive adhesion member is attached to the second surface of the base substrate and the second electrical wiring; and a bottom chassis receiving the optical member and the PCB.

17. The LCD device of claim 16, wherein the PCB attaches to the bottom chassis by the thermally conductive adhesion member.

18. The LCD device of claim 16, wherein the bottom chassis comprises a metal material.

19. The LCD device of claim 16, wherein the thermally conductive adhesion member comprises a plurality of thermally conductive particles including ceramic or metal.

* * * * *